United States Patent
Yeon (10) Patent No.: US 8,102,659 B2
(45) Date of Patent: Jan. 24, 2012

(54) FLEXIBLE PRINTED CIRCUIT BOARD AND LIQUID CRYSTAL DISPLAY HAVING THE SAME

(75) Inventor: Yeun-Mo Yeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 415 days.

(21) Appl. No.: 10/962,716

(22) Filed: Oct. 13, 2004

(65) Prior Publication Data

US 2005/0078459 A1    Apr. 14, 2005

(30) Foreign Application Priority Data

Oct. 14, 2003    (KR) .................. 10-2003-0071260

(51) Int. Cl.
*H05K 1/00*    (2006.01)

(52) U.S. Cl. .................. 361/749; 349/150; 349/151

(58) Field of Classification Search .................. 361/749, 361/750, 751; 174/254, 262; 349/150, 151; 439/67
See application file for complete search history.

(56) References Cited

U.S. PATENT DOCUMENTS

| | | | | |
|---|---|---|---|---|
| 5,821,624 A * | 10/1998 | Pasch | ............................. | 257/776 |
| 5,903,440 A * | 5/1999 | Blazier et al. | .................. | 361/749 |
| 6,180,880 B1 * | 1/2001 | Loibl et al. | ..................... | 174/541 |
| 6,506,978 B1 * | 1/2003 | Furihata | ........................ | 174/254 |
| 6,555,755 B1 * | 4/2003 | Yanagisawa | ................... | 174/254 |
| 6,900,989 B2 * | 5/2005 | Sakata | ........................... | 361/749 |
| 6,943,302 B2 * | 9/2005 | Kageyama et al. | ............ | 174/254 |
| 7,119,285 B2 * | 10/2006 | Kim et al. | ...................... | 174/254 |
| 7,439,449 B1 * | 10/2008 | Kumar et al. | ................... | 174/254 |
| 2003/0122996 A1 * | 7/2003 | Cho | .................................. | 349/65 |
| 2003/0151902 A1 * | 8/2003 | Kageyama et al. | ............ | 361/749 |
| 2003/0179552 A1 * | 9/2003 | Sakata | ........................... | 361/749 |
| 2005/0083474 A1 * | 4/2005 | Park | .............................. | 349/151 |

FOREIGN PATENT DOCUMENTS

| | | |
|---|---|---|
| JP | 62-125272 U | 8/1987 |
| JP | 03-126290 | 5/1991 |
| JP | 04-07267 U | 6/1992 |
| JP | 1992-092667 U | 8/1992 |
| JP | 2000-172193 | 6/2000 |
| JP | 2001-036207 | 2/2001 |
| JP | 2001-223445 | 8/2001 |
| JP | 2001-282147 | 10/2001 |
| KR | 1019990014011 A | 2/1999 |
| KR | 10-2000-0053555 A | 8/2000 |
| TW | 486922 | 5/2002 |
| TW | 538659 | 6/2003 |

* cited by examiner

*Primary Examiner* — Nabil El Hady
*Assistant Examiner* — Abiy Getachew
(74) *Attorney, Agent, or Firm* — Innovation Counsel LLP (57) ABSTRACT

In a flexible printed circuit board and a liquid crystal display, the liquid crystal display includes a flexible printed circuit board electrically connecting a liquid crystal display panel that displays an image and a driving circuit board that outputs a driving signal. The flexible printed circuit board includes a base film, an insulating layer and a signal line disposed between the base film and the insulating layer. The base film or the insulating layer includes an opening formed therethrough. Also, the flexible printed circuit board includes a deformation prevention member by cutting-away an end thereof so as to prevent heat deformation of the flexible printed circuit board. Thus, the liquid crystal display may have reduced size and improved assembly efficiency.

33 Claims, 8 Drawing Sheets

FLEXIBLE PRINTED CIRCUIT BOARD AND LIQUID CRYSTAL DISPLAY HAVING THE SAME

CROSS-REFERENCE TO RELATED APPLICATION

This application relies for priority upon Korean Patent Application No. 2003-71260 filed on Oct. 14, 2003, the contents of which are herein incorporated by reference in its entirety.

BACKGROUND OF THE INVENTION

1. Field of the Invention

The present invention relates to a flexible printed circuit board and a liquid crystal display having the flexible printed circuit board. More particularly, the present invention relates to a flexible printed circuit board capable of preventing disconnection due to thermal expansion thereof and improving assembly efficiency thereof, and a liquid crystal display having the flexible printed circuit board.

2. Description of the Related Art

Recently, information-processing devices have been rapidly developed in a trend with various architectures, functions and faster information processing speed. Information processed in these information-processing devices has an electrical signal format. In order to visually confirm information processed in the information-processing device, a display device for acting as an interface is required.

A liquid crystal display is one of the information-processing devices, and uses liquid crystal so as to display an image. The liquid crystal display has thin thickness, lightweight, low power consumption, low driving voltage, etc. Therefore, the liquid crystal display is widely used in various fields.

The liquid crystal display includes a display unit for displaying an image and a backlight assembly for providing light to the liquid crystal display panel.

In order to display the image using a liquid crystal display panel, the display unit converts image data provided from a driving circuit into a driving signal suitable for driving the liquid crystal display panel, and timely applies the driving signal to the liquid crystal display panel.

For this purpose, the display unit demands a process that processes the image data in a driving chip before the image data is applied to the liquid crystal display panel. That is, the driving chip is connected to the driving circuit so as to receive the image data and timely apply the received image data to data and gate lines of the liquid crystal display panel.

The display unit includes a data side tape carrier package (TCP) on which a data driving chip is mounted by a chip-on-film (COF) method and a gate side TCP on which a gate driving chip is mounted by the COF method.

In recent, in order to reduce a cost, a chip-on-glass (COG) method that directly mounts the data and gate driving chips onto the liquid crystal display is widely applied. The data driving chip is mounted onto a data side of the liquid crystal display panel and connected to data lines, and the gate driving chip is mounted onto a gate side of the liquid crystal display panel and connected to gate lines.

The liquid crystal display panel on which the data and gate driving chips are mounted is electrically connected to the driving circuit via the flexible printed circuit board. Particularly, conductive lines of the flexible printed circuit board and input terminals of the liquid crystal display panel are compressed to each other, so that the conductive lines are electrically connected to the input terminals through an anisotropic conductive film (ACF) disposed between the conductive lines and the input terminals.

However, since a process that compresses the conductive lines of the flexible printed circuit board and the input lines of the liquid crystal display panel is performed under high temperature, the flexible printed circuit board may be expanded due to the heat. As a result, an electrical connection between the conductive lines of the flexible printed circuit board and the input lines of the liquid crystal display panel may be shorted or opened.

Moreover, the flexible printed circuit board coupled to the liquid crystal display panel is outwardly bent to the rear surface of the backlight assembly, and electrically connected to the driving circuit. Thus, a size of the liquid crystal display may increase and assembly efficiency thereof may be deteriorated because the flexible printed circuit board is bent in a predetermined curvature.

BRIEF SUMMARY OF THE INVENTION

The present invention provides a flexible printed circuit board capable of improving assembly efficiency and electrical characteristic thereof.

The present invention also provides a liquid crystal display apparatus having the above flexible printed circuit board.

In one aspect of the present invention, a flexible printed circuit board includes a base film, a first signal line and a first insulating layer.

The first signal line is formed on a first surface of the base film having an insulating material, and transfers an electrical signal externally provided.

The first insulating layer is attached onto the first surface to protect the first signal line, and provided with a first opening formed at a position corresponding to a bending portion of the base film. The first opening includes a plurality of first holes formed at an area that is not overlapped with the first signal line.

The base film may further include a second opening having a plurality of second holes formed at a position corresponding to the bending portion.

Also, the flexible printed circuit board further includes a deformation prevention member so as to prevent the base film from being deformed due to heat. The deformation prevention member is formed by partially cut-away an end of the base film.

In another aspect of the present invention, a liquid crystal display includes a liquid crystal display panel, a driving circuit, a flexible printed circuit board and a backlight assembly.

The liquid crystal display panel includes a data driving chip directly mounted onto a first end thereof and a gate driving chip directly mounted onto a second end substantially perpendicular to the first end.

The driving circuit outputs a driving signal that drives the liquid crystal display panel to apply the driving signal to the liquid crystal display panel through the flexible printed circuit board.

The flexible printed circuit board electrically connects the liquid crystal display panel to the driving circuit, and includes an opening formed at a position corresponding to a bending portion thereof.

The backlight assembly is disposed at a rear portion of the liquid crystal display panel so as to supply a light to the liquid crystal display panel.

According to the flexible printed circuit board and the liquid crystal display having the same, the flexible printed circuit board may have improved assembly efficiency because of the opening formed at the position corresponding to the bending portion thereof. Also, since the flexible printed circuit board includes the deformation prevention member, the liquid crystal display may prevent the flexible printed circuit board from being shorted or opened due to heat expansion.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE PREFERRED EMBODIMENT

Hereinafter, the present invention will be explained in detail with reference to the accompanying drawings.

Figure 1:
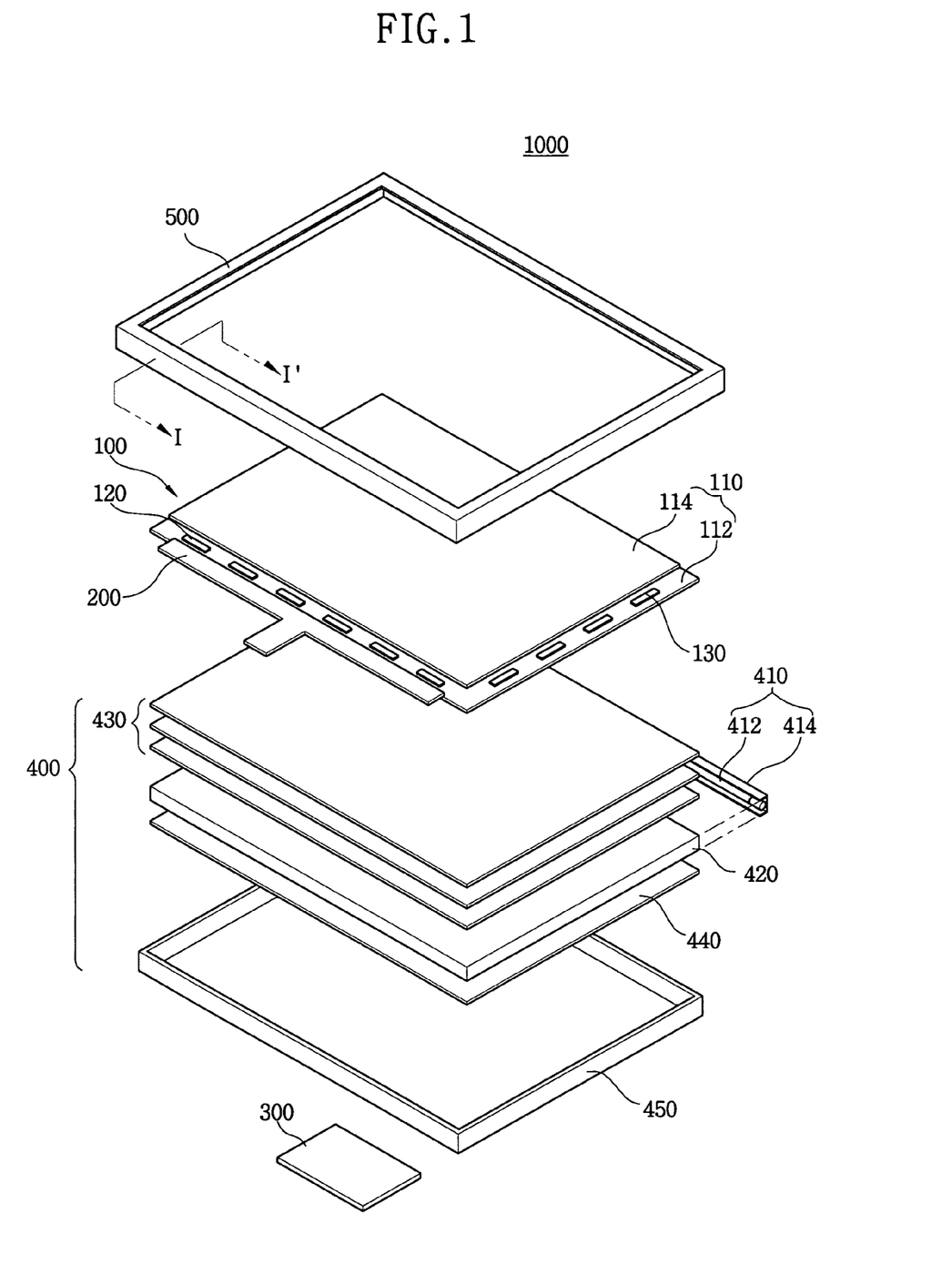
FIG. 1 is an exploded perspective view showing a liquid crystal display according to an exemplary embodiment of the present invention.

FIG. 1 is an exploded perspective view showing a liquid crystal display according to an exemplary embodiment of the present invention.

Figure 2:
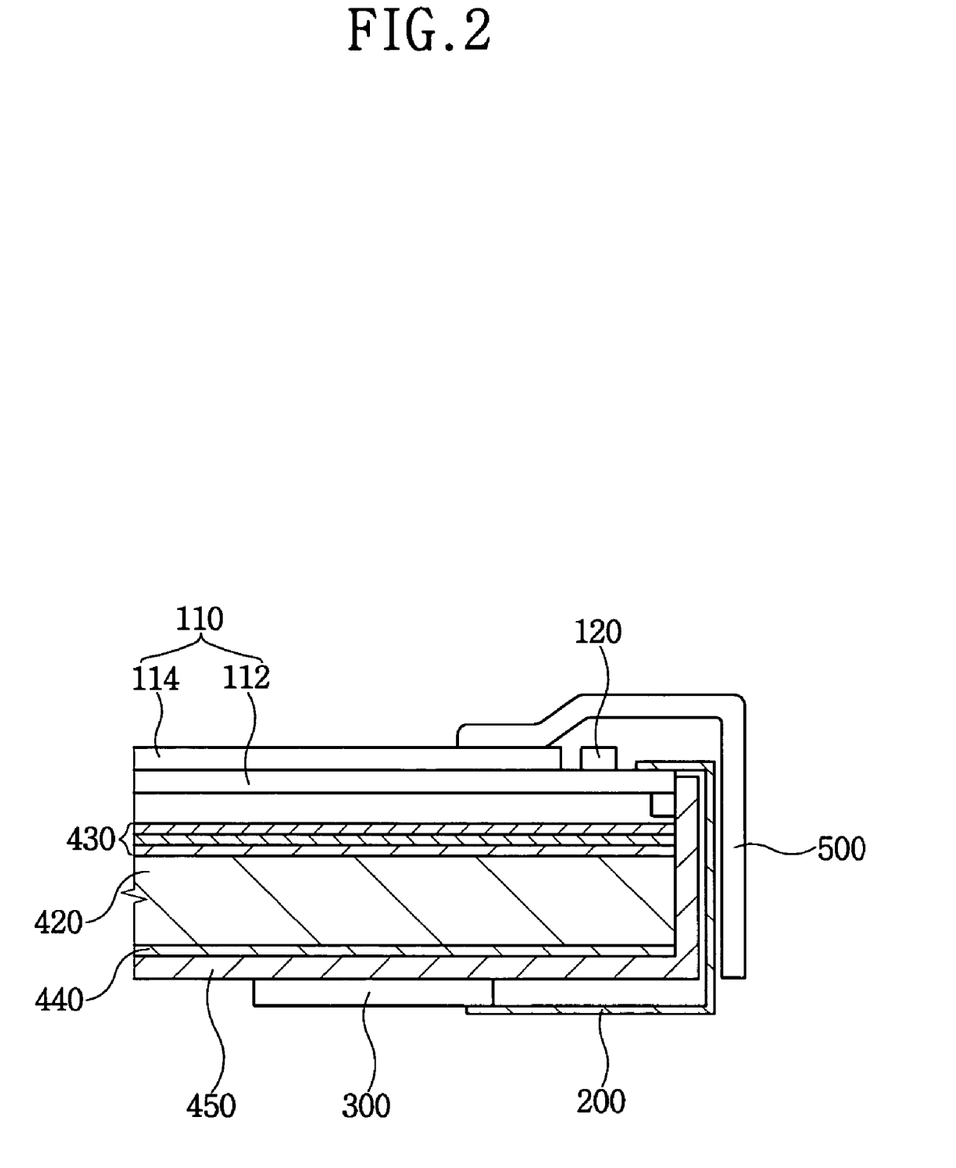
FIG. 2 is a cross-sectional view taken along the line I-I' of FIG. 1.

FIG. 2 is a cross-sectional view taken along the line I-I' of FIG. 1.

Referring to FIGS. 1 and 2, a liquid crystal display 1000 includes a display unit 100 that displays an image, a backlight assembly 400 that supplies a light to the display unit 100, and a top chassis 500 that fixes the display unit 100 to the backlight assembly 400.

The display unit 100 includes a liquid crystal display panel 110 that displays the image, a driving circuit board 300 that outputs a driving signal so as to drive the liquid crystal display panel 110, and a flexible printed circuit board 200 that electrically connects the driving circuit board to the liquid crystal display panel 100.

The liquid crystal display panel 110 includes a thin film transistor (TFT) substrate 112, a color filter substrate 114 coupled to the TFT substrate 112, and a liquid crystal layer (not shown) disposed between the TFT substrate 112 and the color filter substrate 114.

Particularly, the TFT substrate 112 is a transparent glass substrate on which TFTs are arranged as in a matrix configuration as a switching device. Each of the TFTs includes a source terminal connected to a data line, a gate terminal connected to a gate line and a drain terminal connected to a pixel electrode having a transparent conductive material. The color filter substrate 114 includes red, green and blue color pixels formed thereon by a thin film process. The color filter substrate 114 also includes a common electrode having a transparent conductive material coated over the color filter substrate 114.

The display unit 100 further includes a gate driving chip 120 and a gate driving chip 130 so as to drive the liquid crystal display panel 110. The data driving chip 120 is directly mounted onto a first end of the TFT substrate 112 by a chip-on-glass (COG) method, and the gate driving chip 130 is also directly mounted onto a second end of the TFT substrate 112, which is substantially perpendicular to the first end, by the COG method. In the present embodiment, the data driving chip 120 includes an output terminal connected to the data line, and outputs a data signal provided from the flexible printed circuit board 200 to the data line. The gate driving chip 130 includes an output terminal connected to the gate line, and sequentially outputs a gate signal provided from the flexible printed circuit board to the gate line.

The backlight assembly 400 is disposed under the liquid crystal display panel 110 so as to uniformly supply the light to the liquid crystal display panel 110.

The backlight assembly 400 includes a lamp unit 410 having a lamp 412 that generates the light and a lamp reflector 414, a light guide plate 420 that receives the light from the lamp unit 410 and guides the received light to the liquid crystal display panel 110, and a receiving container 450 that receives the lamp unit 410 and the light guide plate 420.

The backlight assembly 400 further includes a plurality of optical sheets 430 and a reflecting plate 440. The optical sheets 430 improve brightness viewed at a front position and a visual angle of the light provided to the liquid crystal display panel 110 from the light guide plate 420. The reflecting plate 440 reflects the light leaked from the light guide plate 420 back to the light guide plate 420 so as to enhance light efficiency. In the present embodiment, the optical sheets 430 includes a diffusion sheet that diffuses the light emitted from the light guide plate 420 and at least one light collecting sheet such as a prism sheet that collects the light.

In the present embodiment, the backlight assembly 400 is an edge type backlight assembly that the lamp 412 is disposed at a position adjacent to a side surface of the light guide plate 420. However, the backlight assembly 400 may be a direct illumination type backlight assembly that a plurality of lamps is disposed under the liquid crystal display panel 110.

The liquid crystal display panel 110 is disposed on the backlight assembly 400. The flexible printed circuit board 200 electrically connected to the end of the liquid crystal display panel 110 is outwardly bent such that the flexible printed circuit board 200 is electrically connected to the driving circuit board 300 disposed on the rear surface of the backlight assembly 400.

Figure 3:
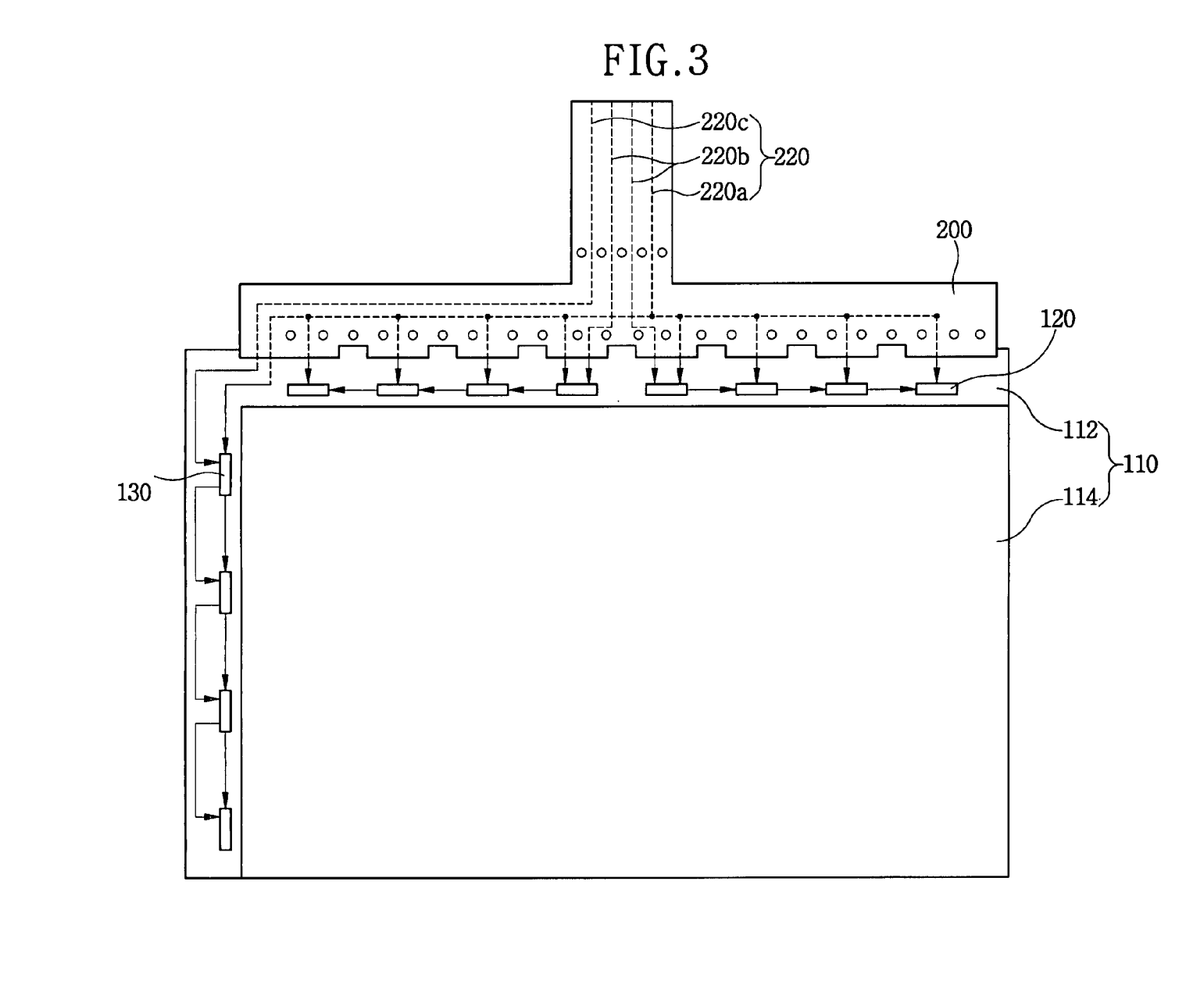
FIG. 3 is a plane view showing the display unit shown in FIG. 1 in detail.
Figure 4:
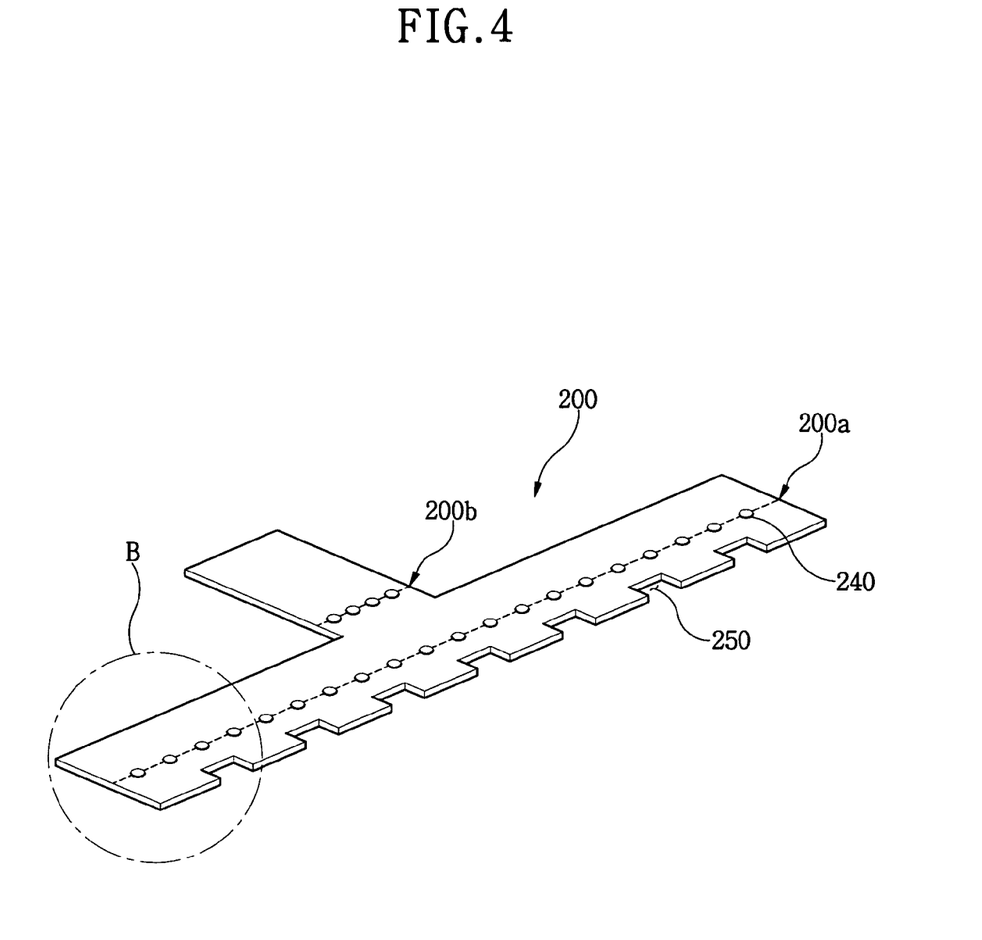
FIG. 4 is a perspective view showing the flexible printed circuit board shown in FIG. 3 according to a first exemplary embodiment of the present invention.
Figure 5:
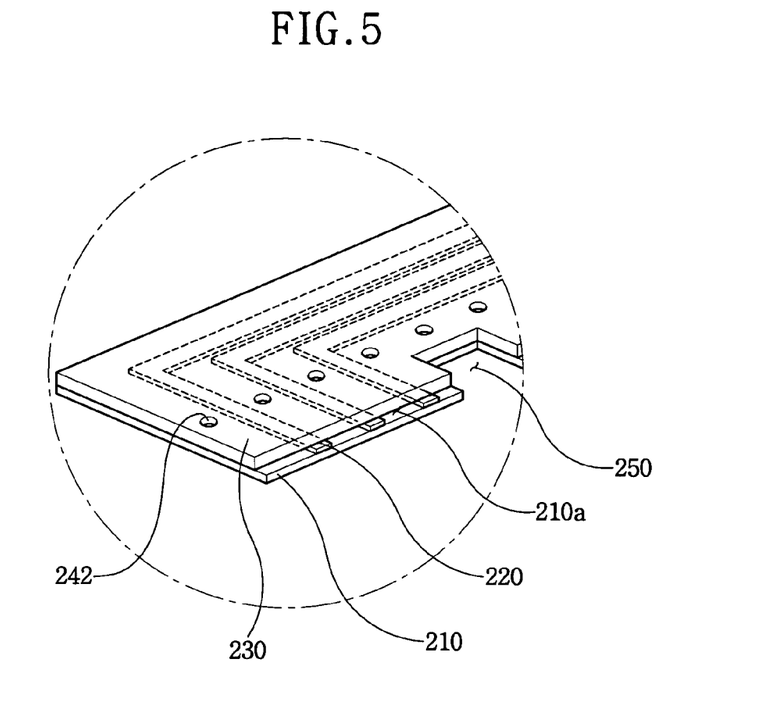
FIG. 5 is a partially enlarged view showing a portion "B" of FIG. 4.

FIG. 3 is a plane view showing the display unit shown in FIG. 1 in detail. FIG. 4 is a perspective view showing the flexible printed circuit board shown in FIG. 3 according to a first exemplary embodiment of the present invention. FIG. 5 is a partially enlarged view showing a portion "B" of FIG. 4.

Figure 6:
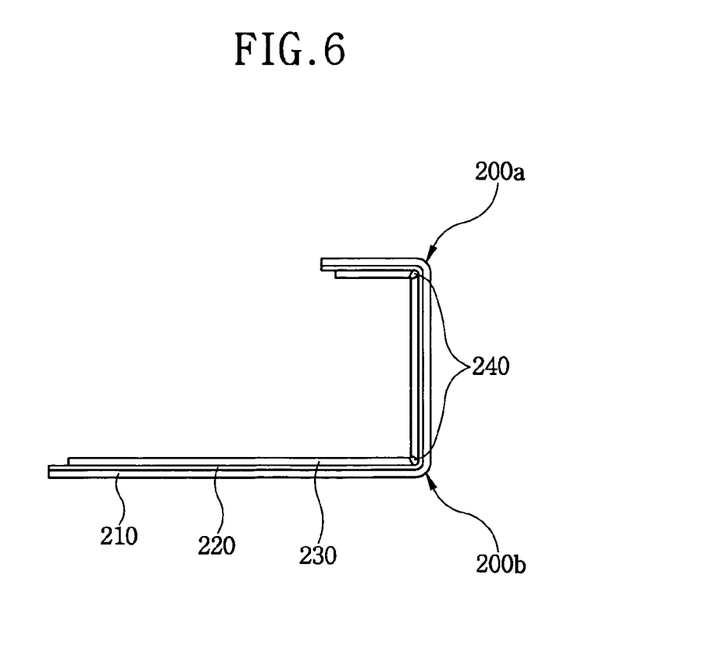
FIG. 6 is a cross-sectional view showing the flexible printed circuit board shown in FIG. 4.

FIG. 6 is a cross-sectional view showing the flexible printed circuit board shown in FIG. 4.

Referring to FIGS. 3 to 6, the display unit 100 includes the liquid crystal display panel 110 that displays the image and the flexible printed circuit board 200 electrically connected to the end of the liquid crystal display panel 110.

The liquid crystal display panel 110 includes the TFT substrate 112 and the color filter substrate 114. The data and gate driving chips 120 and 130 are mounted onto the TFT substrate 112 by the COG method. Also, the flexible printed circuit board 200 is electrically connected to the end, onto which the data driving chip 120 is mounted, of the TFT substrate 112. The flexible printed circuit board 200 is compressed to the TFT substrate 112 by a heat compressive method, so that the flexible printed circuit board 200 is electrically connected to the TFT substrate 112 through the ACF (not shown) disposed between the flexible printed circuit board 200 and the TFT substrate 112.

The flexible printed circuit board 200 includes a base film 210, a first signal line 220 formed on a first surface 210a of the base film 210, and a first insulating layer 230 attached onto the first surface 210a so as to protect the first signal line 220.

The first signal line 220 includes a plurality of metal lines so as to apply the driving signal generated from the driving circuit board 300 to the data and gate driving chips 120 and 130 of the liquid crystal display panel 110.

Particularly, the first signal line 220 includes a power signal line 220a that drives the data and gate driving chips 120 and 130, a data signal line 220b that applies the data signal provided from the driving circuit board 300 to the data driving chip 120, and a gate signal line 220c that applies the gate signal provided from the driving circuit board 300 to the gate driving chip 130. In the present embodiment, the data signal is applied to two data driving chips different from each other via the data signal line 220b divided into two groups, and then the data signal is sequentially applied to all data driving chips via signal lines formed on the TFT substrate 112.

The first insulating layer 230 is formed over the first surface 210a of the base film 210 except an area that the first signal line 220 is connected to the TFT substrate 112. The first insulating layer 230 includes a first opening 240 formed at a position corresponding to a bending portion thereof so as to allow the flexible printed circuit board 200 to be easily and outwardly bent to the receiving container 450.

Particularly, the flexible printed circuit board 200 electrically connected to the TFT substrate 112 is bent toward the rear surface of the backlight assembly 400, so that the flexible printed circuit board 200 may be electrically connected to the driving circuit board 300. As shown in FIG. 6, when the bending portion of the flexible printed circuit board 200 has a right-angled corner, the liquid crystal display may have a reduced size and improved assembly efficiency.

Thus, the flexible printed circuit board 200 is bent at least twice along the bending portion. The bending portion includes a first bending portion 200a spaced apart from the end of the flexible printed circuit board 200 electrically connected to the TFT 112 in a predetermined distance and a second bending portion 200b spaced apart from the first bending portion 200a in a predetermined distance. In order to bend the flexible printed circuit board 200, the first insulating layer 230 includes the first opening 240 corresponding to each of first and second bending portions 200a and 200b.

The first opening 240 may have one hole formed in an oval-shaped opening extended along the first and second bending portions 200a and 200b, however, in the present embodiment, the first opening 240 includes a plurality of holes 242. The first holes 242 are formed in an area where the first holes 242 are not overlapped with the first signal line 220 such that the first signal line 220 is not exposed.

The flexible printed circuit board 200 further includes a deformation prevention member 250 formed at the end thereof electrically connected to the TFT substrate 112 so as to prevent short or open between the flexible printed circuit board 200 and the TFT substrate 112 due to thermal expansion of the flexible printed circuit board 200.

Particularly, the end of the flexible printed circuit board 200 is electrically connected to the TFT substrate 112 through the anisotropic conductive film. The connection using the anisotropic conductive film between the flexible printed circuit board 200 and the TFT substrate 112 is performed by the heat compressive method with a jig of high temperature. The flexible printed circuit board 200 is expanded or contracted due to the compressed heat, so that an aligned position of the first signal line 220 may be deflected. As a result, the flexible printed circuit board 200 may be abnormally connected to the TFT substrate 112.

Thus, the flexible printed circuit board 200 includes the deformation prevention member 250, thereby preventing the heat deformation of the flexible printed circuit board 200 while the heat compressive method is applied. The deformation prevention member 250 includes a plurality of cut-away portions that are formed by partially cutting-away the end of the flexible printed circuit board 200. Since the deformation prevention member 250 buffers the expansion or contraction of the flexible printed circuit board 200, the flexible printed circuit board 200 may reduce the heat deformation.

Also, the deformation prevention member 250 is formed at a position corresponding to a space between the driving chips 120 such that the deformation prevention member 250 does not interfere the connection between the first signal line 220 of the flexible printed circuit board 200 and the data driving chips 120 mounted onto the TFT substrate 112.

The first opening 240 formed through the first insulating layer 230 may have various shapes.

Figure 7:
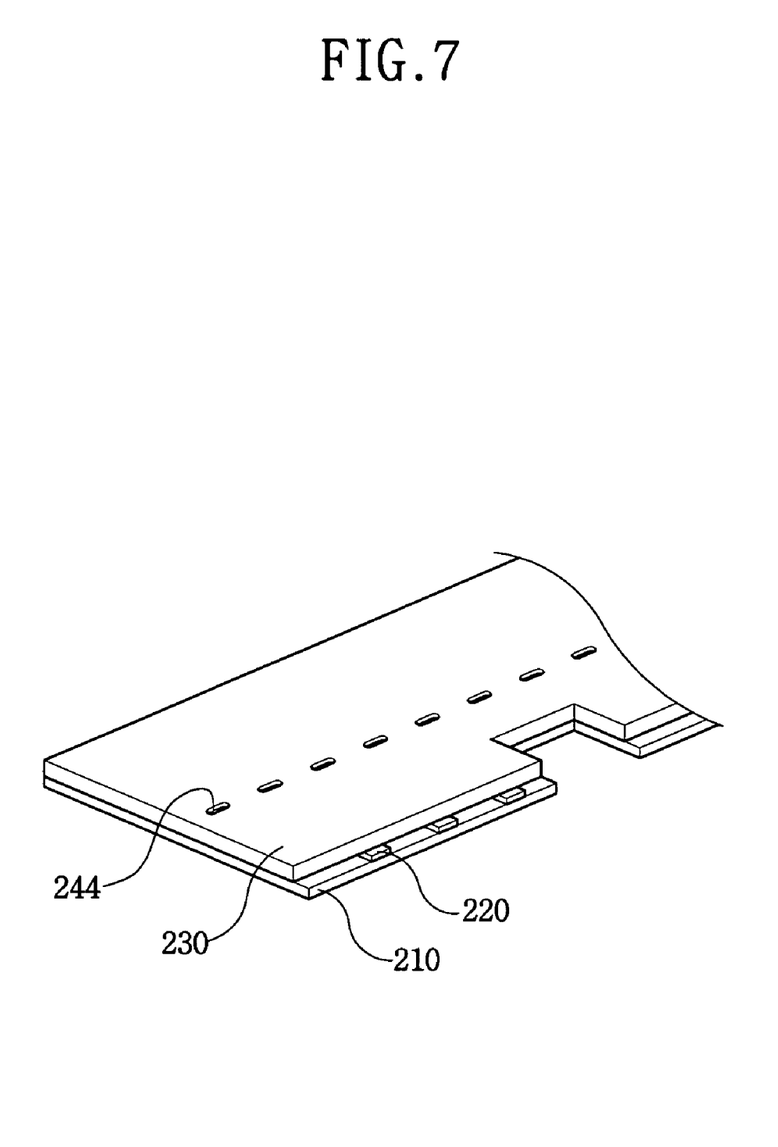
FIG. 7 is a perspective view showing a first opening of a flexible printed circuit board according to another exemplary embodiment of the present invention.

FIG. 7 is a perspective view showing a first opening of a flexible printed circuit board according to another exemplary embodiment of the present invention.

Referring to FIG. 7, the first opening 240 of the flexible printed circuit board 200 according to another exemplary embodiment of the present invention includes a plurality of first holes 244 formed at a position corresponding to the first and second bending portions 200a and 200b. Each of the first holes 244 has an oval-shaped opening extended in a longitudinal direction of the first and second bending portions 200a and 200b, thereby easily bending the flexible printed circuit board 200. The first holes 244 are formed in an area that is not overlapped with the first signal line 220.

Figure 8:
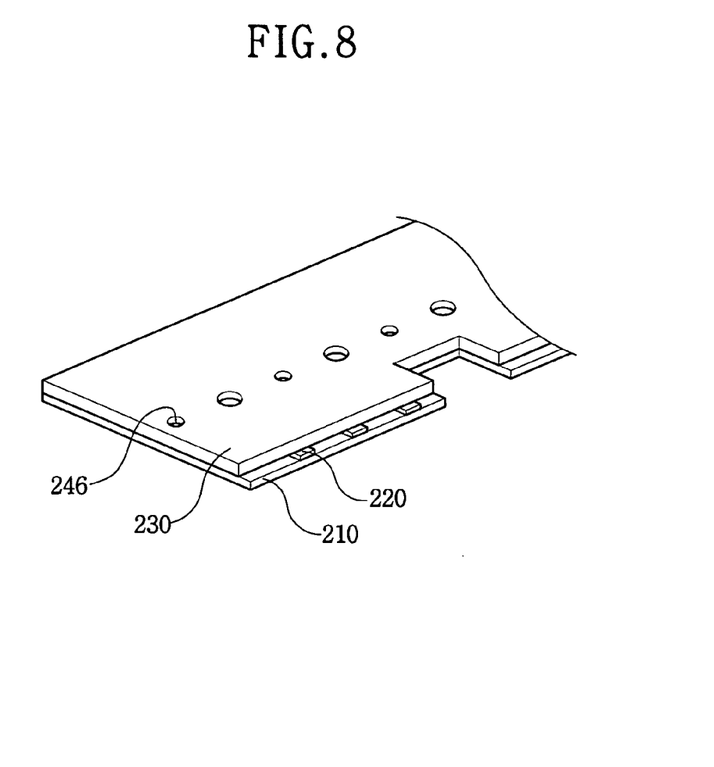
FIG. 8 is a perspective view showing a first opening of a flexible printed circuit board according to another exemplary embodiment of the present invention.

FIG. 8 is a perspective view showing a first opening of a flexible printed circuit board according to another exemplary embodiment of the present invention.

Referring to FIG. 8, the first opening 240 of the flexible printed circuit board 200 according to another exemplary embodiment of the present invention also includes a plurality of first holes 246 formed at a position corresponding to the first and second bending portions 200a and 200b. The first holes 246 have at least two sizes different from each other, and they are alternately arranged. When the first holes 246 have two sizes different from each other, the flexible printed circuit board 200 may prevent cracking of the first signal line 220 while the flexible printed circuit board 200 is bent. The first holes 246 are also formed in an area that is not overlapped with the first signal line 220.

In the present embodiment, the first opening of the flexible printed circuit board may have various shapes so as to easily bend the flexible printed circuit board.

Figure 9:
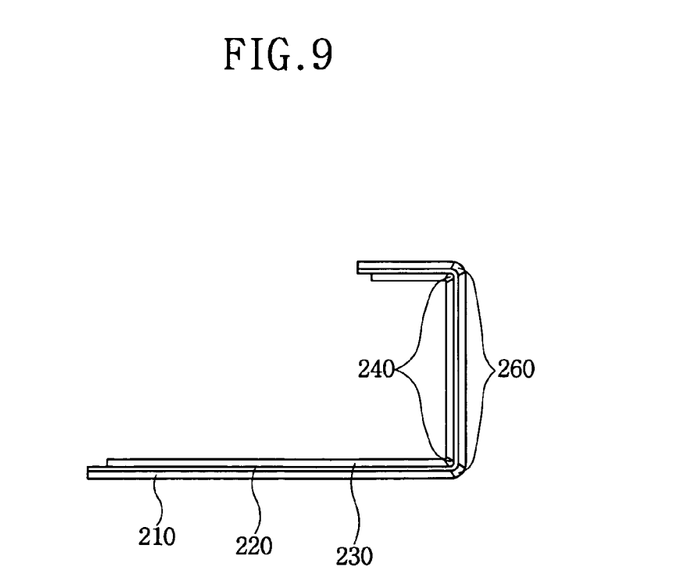
FIG. 9 is a cross-sectional view showing a flexible printed circuit board according to a second exemplary embodiment of the present invention.

FIG. 9 is a cross-sectional view showing a flexible printed circuit board according to a second exemplary embodiment of the present invention.

Referring to FIG. 9, a flexible printed circuit board 200 includes a base film 210, a first signal line 220 and a first insulating layer 230.

The first signal line 220 is disposed between the base film 210 having an insulating material and the first insulating layer 230. In order to electrically connect the TFT substrate 112 and the driving circuit substrate 300, both ends of the first insulating layer 230 are partially opened to expose the first signal line 220.

The first insulating layer 230 includes a first opening 240 formed at a position corresponding to a bending portion thereof such that the flexible printed circuit board 200 is easily and outwardly bent to the rear surface of the receiving container 450. The first opening 240 includes a plurality of first holes, and each of the first holes has a circular-shaped opening or an oval-shaped opening extended in a longitudinal direction of the bending portion.

The base film 210 includes a second opening 260 formed therethrough such that the flexible printed circuit board 200 is easily and outwardly bent to the rear surface of the receiving container 450. The second opening 260 includes a plurality of second holes, and each of the second holes has the circular-shaped opening or the oval-shaped opening extended in the longitudinal direction of the bending portion. The first and second holes may be in one to one correspondence relationship, or the second holes may be formed at a position different from that of the first holes. In case that the first and second holes are formed after the base film 210 and the first insulating layer 230 are attached to each other, the first and second openings 240 and 260 may be formed simultaneously. The first and second holes are formed in an area that is not overlapped with the first signal line 220.

As described above, when holes such as the first holes, the second holes, etc., are formed through the first insulating layer 230 and the base film 210, the flexible printed circuit board 200 may be easily bent outside the receiving container 450.

Figure 10:
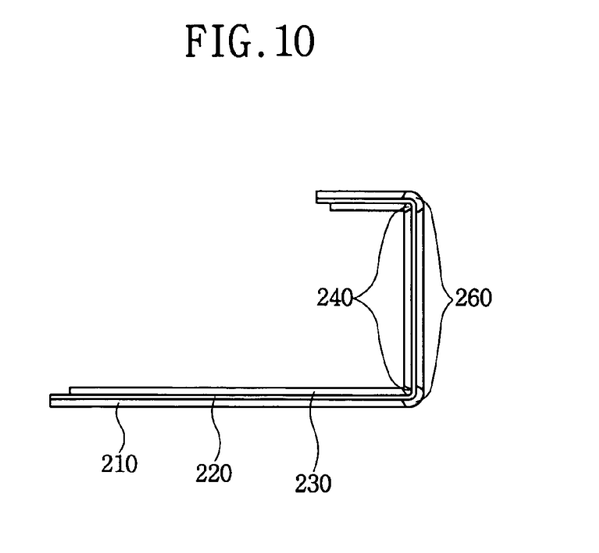
FIG. 10 is a cross-sectional view showing a flexible printed circuit board according to a third exemplary embodiment of the present invention.

FIG. 10 is a cross-sectional view showing a flexible printed circuit board according to a third exemplary embodiment of the present invention.

Referring to FIG. 10, a flexible printed circuit board 200 according to a third exemplary embodiment of the present invention includes a base film 210, a first signal line 220 and a first insulating layer 230.

The first insulating layer 230 includes a first opening 240 having a plurality of first holes formed at a position corresponding to a bending portion of the flexible printed circuit board 450. The base film 210 includes a second opening 240 having a plurality of second holes formed at a position corresponding to the bending portion of the flexible printed circuit board 450. The first and second holes may be in one to one correspondence relationship, or the first and second holes may be formed at positions different from each other.

The second holes are larger than the first holes in size. That is, when the flexible printed circuit board 200 is bent, the first insulating layer 230 is positioned inside the flexible printed circuit board 200, and the base film 210 is positioned outside the flexible printed circuit board 200. Thus, the second holes formed through the base film 210 has a curvature radius greater than that of the first holes formed through the first insulating layer 230 while the flexible printed circuit board 200 is bent. Thus, when the second holes are larger than the first holes in size, the flexible printed circuit board 200 may be easily bent outside the receiving container 450.

The flexible printed circuit board 200, generally, includes the signal line formed on a single-layer, but the flexible printed circuit board 200 may include the signal line formed on a double-layer.

Figure 11:
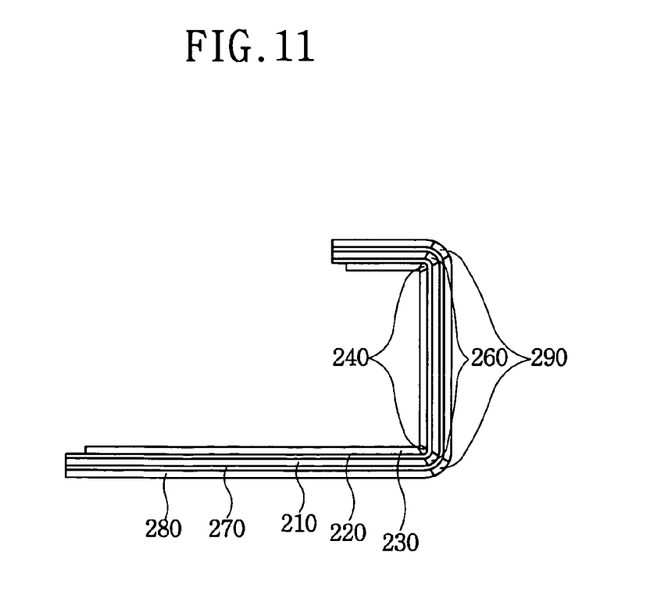
FIG. 11 is a cross-sectional view showing a flexible printed circuit board according to a fourth exemplary embodiment of the present invention.

FIG. 11 is a cross-sectional view showing a flexible printed circuit board according to a fourth exemplary embodiment of the present invention.

Referring to FIG. 11, a flexible printed circuit board 200 according to a fourth exemplary embodiment of the present invention includes a base film 210, a first signal line 220 formed on a first surface of the base film 210, and a first insulating layer 230 formed over the first surface of the base film 210 so as to protect the first signal line 220. Also, the flexible printed circuit board 200 further includes a second signal line 270 formed on a second surface opposite to the first surface, and a second insulating layer 280 formed over the second surface of the base film 210 so as to protect the second signal line 270.

The first and second signal lines 220 and 270 are electrically connected to each other through a via hole, and are formed on different layers from each other.

The flexible printed circuit board 200 also includes openings formed at a position corresponding to a bending portion thereof.

Particularly, the first insulating layer 230 includes a first opening 240 having a plurality of first holes formed at a position corresponding to the bending portion. The base film 210 may further include a second opening 260 having a plurality of second holes corresponding to the first holes. The second insulating layer 280 may further include a third opening 290 having a plurality of third holes corresponding to the second holes. The first, second and third holes may be simultaneously formed after the first and second insulating layers 230 and 280 are formed on the base film 210.

The first, second and third holes may have an equal size to each other. Also, the second holes may have a size larger than the first holes, and the third holes may have a size larger than the second holes. The first, second and third holes are formed at an area that is not overlapped with the first and second signal lines 220 and 270. Each of the first, second and third holes has a circular-shaped opening or an oval-shaped opening extended in a longitudinal direction of the bending portion of the flexible printed circuit board 200.

The flexible printed circuit board according to second to fourth exemplary embodiments also includes the deformation prevention member 250 so as to prevent deformation of the flexible printed circuit board due to heat (refer to FIG. 5).

According to the flexible printed circuit board and the liquid crystal display, the flexible printed circuit board that electrically connects the liquid crystal display panel and the driving circuit board includes the opening formed therethrough. Thus, the liquid crystal display may have reduced size and improved assembly efficiency.

Furthermore, since the flexible printed circuit board includes the deformation prevention member, the liquid crystal display may prevent the flexible printed circuit board from being shorted or opened due to heat expansion when the flexible printed circuit board is coupled to the liquid crystal display panel by a heat compressive method.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible printed circuit board comprising:
a base film including an insulating material;
a plurality of first signal lines formed on a first surface of the base film so as to transfer electrical signals externally provided; and
a first insulating layer attached onto the first surface so as to protect the first signal lines, the first insulating layer including a first opening portion formed therethrough, the first opening portion being formed at a position corresponding to a bending portion of the base film, the first opening portion comprising a plurality of first holes, each of the first holes being disposed between adjacent first signal lines.

2. The flexible printed circuit board of claim 1, wherein the base film further comprises a second opening portion formed therethrough, the second opening portion being formed between the adjacent first signal lines at a position corresponding to the bending portion of the base film.

3. The flexible printed circuit board of claim 2, wherein the second opening portion comprises a plurality of second holes.

4. The flexible printed circuit board of claim 3, wherein the first and second holes are formed at an area where the first and second holes are not overlapped with the first signal lines.

5. The flexible printed circuit board of claim 4, wherein the first and second holes are overlapped with each other.

6. The flexible printed circuit board of claim 3, wherein each of the first and second holes has a circular-shaped opening or an oval-shaped opening extended in a longitudinal direction of the bending portion.

7. The flexible printed circuit board of claim 3, wherein the second hole is larger than the first hole.

8. The flexible printed circuit board of claim 3, wherein the first holes have at least two sizes different from each other, and the second holes have at least two sizes different from each other.

9. The flexible printed circuit board of claim 2, wherein the bending portion comprises:
a first bending portion spaced apart from a first end of the base film in a predetermined distance; and
a second bending portion spaced apart from the first bending portion in a predetermined distance.

10. The flexible printed circuit board of claim 2, wherein the first end of the base film is electrically connected to a liquid crystal display panel that displays an image, and a second end opposite to the first end is electrically connected to a driving circuit that outputs a driving signal to drive the liquid crystal display panel.

11. The flexible printed circuit board of claim 10, further comprising a deformation prevention member formed at the first end of the base film so as to prevent the base film from being deformed due to heat therefrom.

12. The flexible printed circuit board of claim 11, wherein the deformation prevention member is a cut-away portion that is formed by partially cutting the base film from the first end toward the second end.

13. The flexible printed circuit board of claim 12, wherein the cut-away portion is formed at a position corresponding to a space between a plurality of driving chips mounted on the liquid crystal display panel.

14. The flexible printed circuit board of claim 1, further comprising: a second signal line formed on a second surface of the base film, the second surface being opposite to the first surface; and a second insulating layer attached onto the second surface so as to protect the second signal line.

15. The flexible printed circuit board of claim 14, wherein the second insulating layer further comprises a third opening portion formed therethrough, the third opening portion being formed at a position corresponding to the bending portion of the base film.

16. The flexible printed circuit board of claim 15, wherein the third opening portion comprises a plurality of third holes, and the third holes are larger than the first holes in size.

17. The flexible printed circuit board of claim 16, wherein the first and third holes are formed at an area where the first and third holes are not overlapped with the first and second signal lines.

18. The flexible printed circuit board of claim 17, wherein the base film further comprises a second opening portion having a plurality of second holes,
wherein the first, second and third holes are overlapped with each other.

19. The flexible printed circuit board of claim 14, wherein the base film comprises at least two bending portions.

20. The flexible printed circuit board of claim 14, wherein the base film further comprises a deformation prevention member so as to prevent deformation of the base film, wherein the deformation prevention member comprises a plurality of cut-away portions formed by partially cutting the base film from the first end toward the second end, and spaced apart from each other.

21. A liquid crystal display comprising: a liquid crystal display panel to display an image; a driving circuit to output a driving signal so as to drive the liquid crystal display panel; a flexible printed circuit board including a base film, a plurality of first signal lines formed on a first surface of the base film and a first insulating layer on the first surface on which the first signal lines are formed so as to electrically connect the liquid crystal panel and the driving circuit, the base film or the first insulating layer including an opening portion formed at a position which corresponds to a bending portion to which the base film is bent, the opening portion comprising a plurality of holes, each of the holes being disposed between adjacent first signal lines; and
a light supplying part to supply a light to the liquid crystal display panel.

22. The liquid crystal display of claim 21, wherein the opening portion comprises:
a first opening portion including a plurality of first holes and formed through the first insulating layer; and
a second opening portion including a plurality of second holes and formed through the base film.

23. The liquid crystal display of claim 22, wherein the first and second holes are formed in an area that is not overlapped with the first signal lines, and the second holes are equal to or larger than the first holes.

24. The liquid crystal display of claim 21, wherein the flexible printed circuit board further comprises: a second signal line formed on a second surface opposite to the first surface of the base film; and a second insulating layer attached onto the second surface on which the second signal line is formed.

25. The liquid crystal display of claim 24, wherein the second insulating layer further comprises a third opening portion formed at a position corresponding to the bending portion, and the third opening portion comprises a plurality of third holes.

26. The liquid crystal display of claim 21, wherein the liquid crystal display panel comprises: a first substrate; a second substrate coupled to the first substrate; a liquid crystal layer disposed between the first and second substrates; a data driving chip mounted on a first end of the first substrate; and a gate driving chip mounted on a second end of the first substrate, which is substantially perpendicular to the first end.

27. The liquid crystal display of claim 26, wherein the flexible printed circuit board comprises a first end electrically connected to the first substrate and a second end electrically connected to the driving circuit, the first and second ends of the flexible printed circuit board are opposite to each other.

28. The liquid crystal display of claim 27, wherein the flexible printed circuit board further comprises a deformation prevention member formed at the first end of the base film so as to prevent the base film from being deformed due to heat therefrom.

29. The liquid crystal display of claim 28, wherein the deformation prevention member is a cut-away portion that is formed by partially cutting the base film from the first end toward the second end, and the deformation prevention member is formed between the data driving chip and an adjacent data driving chip.

30. The liquid crystal display of claim 27, wherein the bending portion comprises: a first bending portion spaced apart from the first end of the base film in a predetermined distance and bent toward a side surface of the light supplying part; and a second bending portion spaced apart from the first bending portion in a predetermined distance and bent toward a rear surface of the light supplying part.

31. The liquid crystal display of claim 30, wherein the bending portion further comprises a third bending portion spaced apart from the second bending portion so as to be connected to the driving circuit.

32. The liquid crystal display of claim 27, wherein an overlapped width between the first end and the first substrate electrically connected to each other is equal to or greater than an overlapped width between the second end and the driving circuit electrically connected to each other.

33. The flexible printed circuit board of claim 1, wherein the first opening portion exposes a portion of the base film.

* * * * *